United States Patent [19]

Erhardt

[11] Patent Number: 5,105,264
[45] Date of Patent: Apr. 14, 1992

[54] COLOR IMAGE SENSOR HAVING AN OPTIMUM EXPOSURE TIME FOR EACH COLOR

[75] Inventor: Herbert J. Erhardt, Rochester, N.Y.

[73] Assignee: Eastman Kodak Company, Rochester, N.Y.

[21] Appl. No.: 589,877

[22] Filed: Sep. 28, 1990

[51] Int. Cl.$^5$ .................. H04N 9/07; H04N 9/077
[52] U.S. Cl. .................. 358/48; 358/44; 358/43; 358/213.19
[58] Field of Search ............ 358/213.11, 213.13, 358/213.19, 213.29, 212, 213.31, 29 C, 41, 43, 44, 48, 50; 357/24 LR; 250/208.1

[56] References Cited

U.S. PATENT DOCUMENTS

| | | | |
|---|---|---|---|
| 4,638,354 | 1/1987 | Denimal | 358/106 |
| 4,709,259 | 11/1987 | Suzuki | 358/48 |
| 4,710,803 | 12/1987 | Suzuki et al. | 358/41 |
| 4,809,061 | 2/1989 | Suzuki | 358/75 |
| 4,882,616 | 11/1989 | Manabe | 358/44 |
| 4,975,777 | 12/1990 | Lee et al. | 358/213.19 |

Primary Examiner—James J. Groody
Assistant Examiner—Safet Metjahic
Attorney, Agent, or Firm—Donald D. Schaper

[57] ABSTRACT

An image sensor is disclosed which is adapted to sense a color image and comprises three channels, one for each of the primary colors. Each channel is identical except for the color of the filter associated therewith. In order to provide the optimum exposure time for each of the colors, the integration time for each of the channels is controlled independently. The line readout time for each of the channels is maintained the same, however, so that the three channels can be read out in parallel.

15 Claims, 4 Drawing Sheets

COLOR IMAGE SENSOR HAVING AN OPTIMUM EXPOSURE TIME FOR EACH COLOR

BACKGROUND OF THE INVENTION

1. Field of the Invention

The present invention relates to to an image sensor, and more particularly, to a color image sensor.

2. State of the Prior Art

It is desirable to control the exposure in an image sensor such as a charge-coupled device (CCD). If an image sensor receives too much exposure, the resultant saturation and/or "blooming" destroys the spatial information and linearity of the video signal. If the exposure is too low, the signal-to-noise ratio and dynamic range suffer. Ideally, the maximum exposure is controlled to a point just below device saturation. The exposure can be controlled by either adjusting the source illumination (radiance), the collection optics (the solid angle subtended), or the time-duration of light collection (the integration time).

The integration time of CCD's can be controlled electronically. Typically, line time, i.e., the time between successive transfers of charge from the photodetectors to the shift registers, and the integration time are the same. However, there are sensors which electronically divert the photodetector charge to the substrate (so that no charge is collected) during the first portion of the line time, and then isolate the photodetector (so that charge is collected) for the the remainder of the line time. This is referred to as electronic exposure control or electronic shuttering.

Electronic exposure control has been previously used in monochrome linear CCD sensors. There is a problem, however, in using electronic exposure control for color image sensors. Integrated color linear CCD sensors have taken two forms. In one form, patterned color filters (such as a repeating red-green-blue pattern) have been placed on a single linear CCD. In another form, individual filters have been placed on three linear CCD's fabricated on a single substrate. A problem in controlling the exposure in both types of these sensors is that different colors should receive different integration times. One reason that different integration times are needed is that the red, green, and blue filters do not transmit the same photon flux in the pass bands for red, green, and blue, respectively. Another reason is that the light sources for scanners are not spectrally balanced; a tungsten light source, for example, is heavily weighted in the red.

One attempt at solving the problem of providing the proper exposure for each of the colors in a color image sensor is disclosed in U.S. Pat. No. 4,709,259, to Suzuki. This patent discloses a color image sensor which has a matrix of photodiodes each of which is adapted to sense red, green, or blue light. Charge signals stored in the photodiodes are transferred by means of MOS switches to three horizontal shift registers, one for each of the primary colors. Three vertical shift registers are provided to turn on the MOS switches for each color, and the charge storage time for each color is varied by varying the operating times of the three vertical shift registers. One of the main problems with the arrangement shown in the Suzuki patent is that the three colors cannot be clocked out in parallel, and thus, a complicated timing arrangement is necessary in order to process the signals.

SUMMARY OF THE INVENTION

It is an object of the present invention to overcome the problems in the prior art discussed above and to provide an improved color image sensor.

In accordance with the present invention, there is provided an image sensor comprising: an array of image sensor elements, each of the elements being adapted to produce a color representation of a portion of a color image, some of the elements being adapted to sense a color different from other of the elements; and means for controlling the integration time of each of the sensor elements in accordance with the color which the element is adapted to sense.

In one embodiment of the present invention, the image sensor comprises three channels, one channel for each of the primary colors. Each channel is identical except for the color of the filter which overlies the image sensor elements. Each channel comprises a line of photodiodes and an adjacent CCD shift register. Charge carriers accumulated in the photodiodes are transferred to the CCD shift register through a transfer gate located between the photodiodes and the shift register. A line of charge packets in the shift register are then sequentially read out to an output circuit. An exposure drain is located adjacent each of the photodiodes, and an exposure control gate between the photodiode and the drain controls the flow of charge carriers from the photodiode to the drain. The potential on the exposure control gate can be controlled to control the effective integration time of the photodiode. The integration time for each of the channels can be different and is controlled in accordance with the color being sensed by that channel. The line readout time for each of the channels is the same, however, and thus, all of the channels can be read out in parallel.

One of the main advantages of the present invention is that an optimum exposure time is obtained for each of the colors in a color CCD image sensor. A further advantage is that a common line time is maintained in such a sensor for all three channels. A still further advantage of the invention is that blooming can also be prevented in such a sensor.

Other features and advantages will become apparent upon reference to the following description of the preferred embodiment when read in light of the attached drawings.

DESCRIPTION OF THE PREFERRED EMBODIMENT

The present invention is described herein with reference to an image sensor which comprises a plurality of image elements, each of the elements including a photodetector, a CCD, a drain, and the appropriate transfer gates. The present invention can also be used with other types of image sensors, for example, image sensors in which the elements include an accumulation region, and the charge carriers are transferred from the photodetector to the accumulation region and then to the CCD. Further, the image sensor is described as a tri-linear sensor in which individual color filters are placed over three linear arrays; however, the invention is equally applicable to a single linear array with a patterned color filter in which a separate transfer gate is available for each cell.

Figure 1:
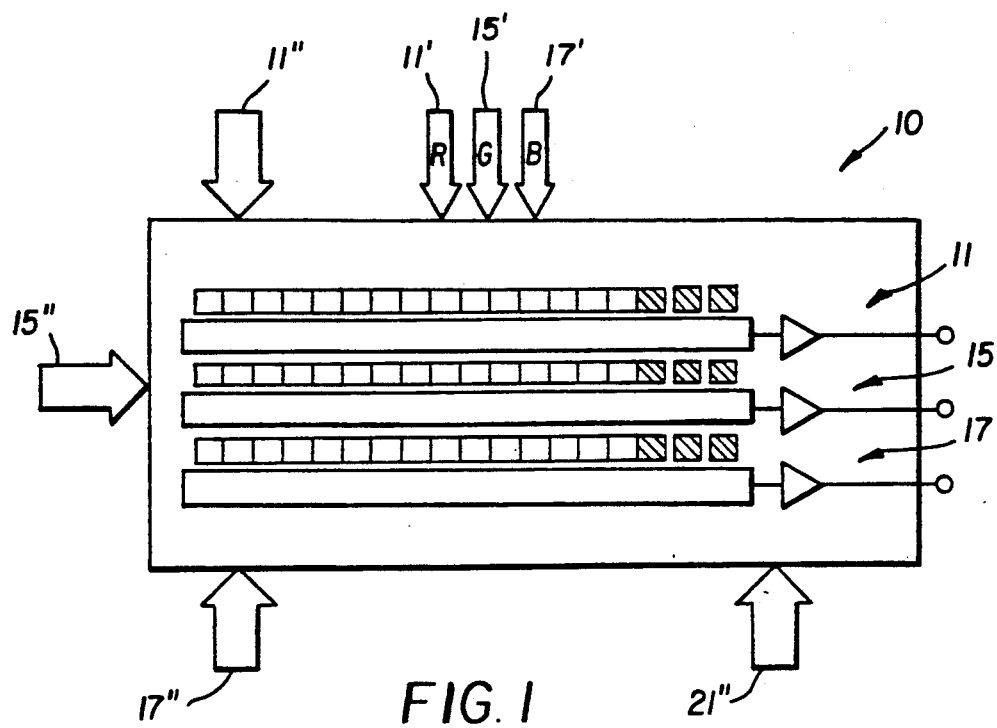
FIG. 1 is a schematic plan view of the image sensor of the present invention.

With reference to FIG. 1, there is shown a schematic view of an image sensor 10 constructed in accordance with the present invention. Image sensor 10 comprises a red channel 11, a green channel 15, and a blue channel 17. As will be explained in more detail hereinafter, independent signals 11', 15', and 17' are provided to the channels for exposure control, and independent clock signals 11'', 15'', and 17'' are provided to the channels for readout of the sensor. Common detector-to-shift register clock signals are provided to sensor 10, as indicated by arrow 21. Image sensor 10 can be used in a device, such as a film scanner, to record electrical signals representative of a color image.

Figure 2:
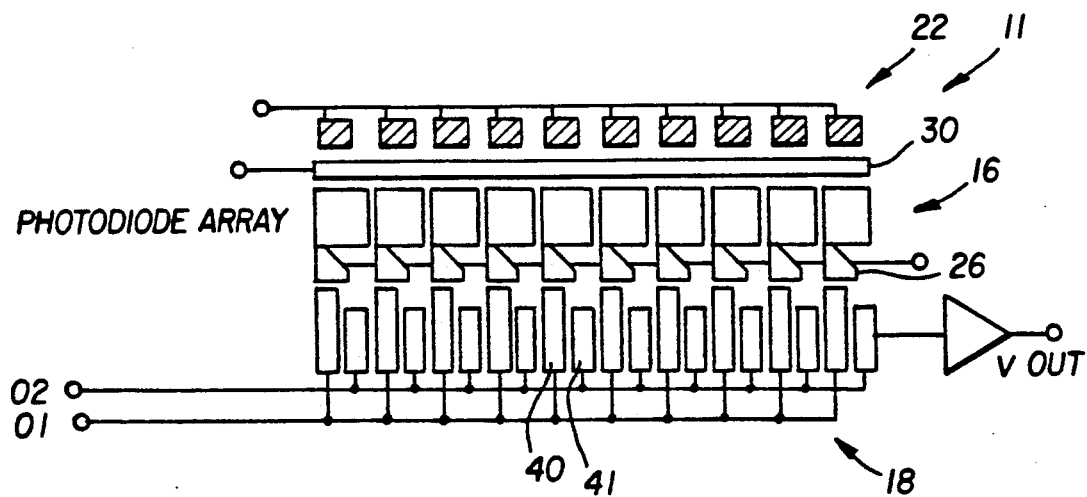
FIG. 2 is a plan view of one channel of the image sensor.
Figure 3:
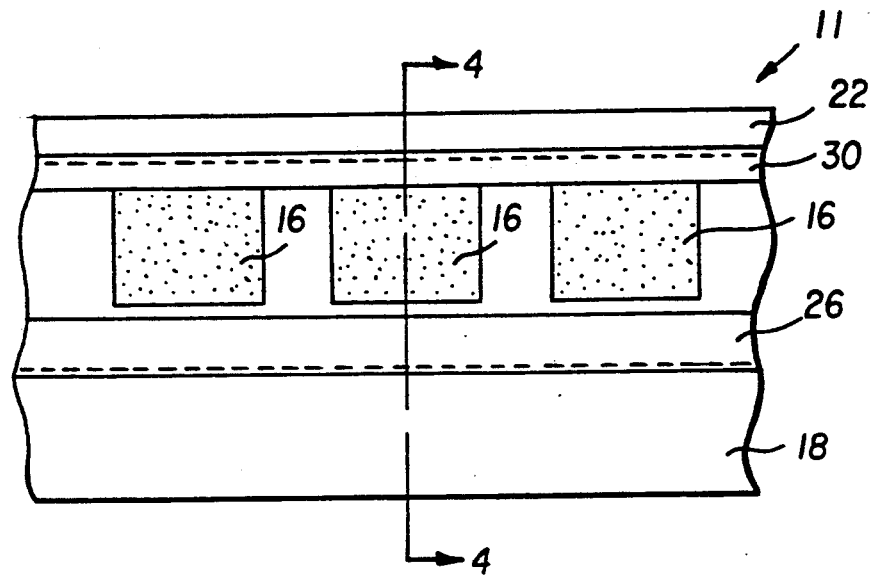
FIG. 3 is an enlarged top plan view of a portion of one channel.
Figure 4:
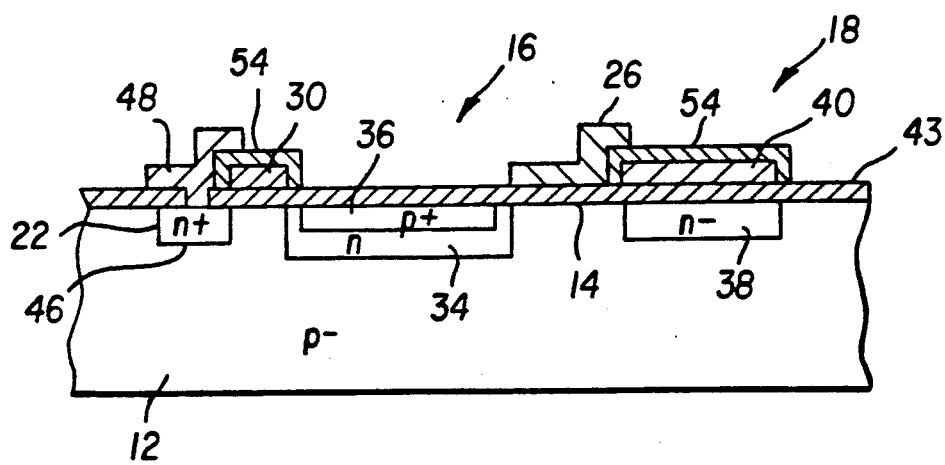
FIG. 4 is a sectional view taken along line 4—4 in FIG. 3.

Each of the channels 11, 15, and 17 is constructed as shown generally in FIG. 2 and in more detail in FIGS. 3 and 4. Each of the channels 11, 15, 17, is identical, except for the color filter (not shown) used in the channel; thus, only channel 11 will be described in detail. Channel 11 comprises a substrate 12 having a major (top) surface 14. Substrate 12 can be made from a semiconductor material such as p-type single crystalline silicon. A line of photodetectors 16 are disposed in substrate 12 along the major surface 14. Extending adjacent each line of photodetectors 16 is a CCD shift register 18. Between each photodetector 16 and shift register 18 is a transfer gate 26. On an opposite side of the photodetectors 16, exposure drain 22 extends along and substantially parallel to the line of photodetectors 16. An exposure control gate 30 extends along the space between the line of photodetectors 16 and the adjacent exposure drain 22.

As shown in FIG. 4, each photodetector 16 is a photodiode of the type which includes an n-type conductivity region 34, (shown as n) in the substrate 12 at the major surface 14. Typically the conductivity of region 34 is about $10^{17}$ impurities/cm$^3$. The substrate 12 is preferably of p/type conductivity (shown as p-), typically of $10^{15}$ impurities/cm$^3$, or it can have a p-type well in the surface 14 of an n-type conductivity substrate in which the photodiode is formed. A second, highly conductive, p-type conductivity region 36 (shown as p+), typically of a conductivity of $10^{18}$ impurities/cm$^3$, exists within a portion of the first region 34 at the substrate surface 14. Regions 12, 34 and 36 form a pinned, or buried, diode. However, instead of the photodiode 16 shown, any other known type of photodetector can be used, such as a Schottky barrier photodetector or a simple pn junction diode.

The CCD shift register 18 may be of any well known construction. A buried channel configuration is shown in FIG. 4. The shift register 18 comprises an n-type conductivity channel region 38 (shown as n-) of impurity concentration of about $10^{17}$ impurities/cm$^3$ in the substrate 12 at the surface 14. The channel region 38 extends along the surface 14 spaced from and parallel to the line of photodetectors 16. Over the channel region 38 are a plurality of conductive gates 40 and 41 (FIG. 2) which are spaced along the channel region 38. The gates 40 and 41 can be made of a metal or conductive polycrystalline silicon, and the gates are insulated from the subsrate surface 14 by a layer 43 of a dielectric, typically silicon oxide. The gates 40 and 41 are connected to a potential source by means of bus lines $\phi 1$ and $\phi 2$ (FIG. 2) for selectively applying a potential to the gates to operate the shift register 18.

The exposure drain 22 is formed by a region 46 of n+ type conductivity (shown as n+) and of a conductivity of about $10^{19}$ impurities/cm$^3$ in the substrate 12 and extending to the surface 14. The region 46 extends along the entire length of the line of photodetectors 16 and is spaced from the photodetectors. The drain region 46 is connected to a source of potential (not shown) through a conductive contact 48.

Each of the gates 26 and 30 is a strip of a conductive material, such as a metal or conductive polycrystalline silicon, which is on the silicon oxide layer 43. The transfer gate 26 extends over the space between the shift register 18 and the line of photodetectors 30 and overlaps the shift register gates 40. The transfer gate 26 is insulated from the shift register gates 40 by a layer 54 of silicon oxide which covers the shift register gates 40. The exposure control gate 30 extends across the space between the exposure drain region 46 and the line of photodetectors 16 along the full length thereof. The exposure control gate 30 overlaps the exposure drain region 46.

In the conventional operation of an image sensor of the type described herein, charge carriers are allowed to accumulate in photodetectors 16. Raising and then lowering the potential of transfer gate 26 causes the charge accumulated in the photodetectors 16 to be transferred into shift register 18 in a manner well known in the art. The line of charge packets in the shift register 18 are then sequentially read out. At the end of the readout for one line, the next line of charge is again transferred from the photodiodes 16 into the shift register 18. The integration time (i.e., the time that charge is allowed to accumulate) is thus equal to the line readout time (the time between successive transfers of charge).

In the present invention, the potential on the exposure control gate 30 is controlled to adjust the effective integration time to be less than or equal to the line readout time. Raising the potential on exposure control gate 30 causes the photo-induced charge normally accumulating in the photodiodes 16 to be transferred into the exposure drain 22 where it is removed by externally-applied bias. Lowering the potential on exposure control gate 30 isolates the photodiodes 16 allowing photo-induced charge to accumulate in the normal manner. It will be seen that by coordinating the timing of the exposure control gate 30 and transfer gate 26, the integration time can be adjusted to a fraction of the line readout time. This process is known as electronic shuttering.

Figure 5:
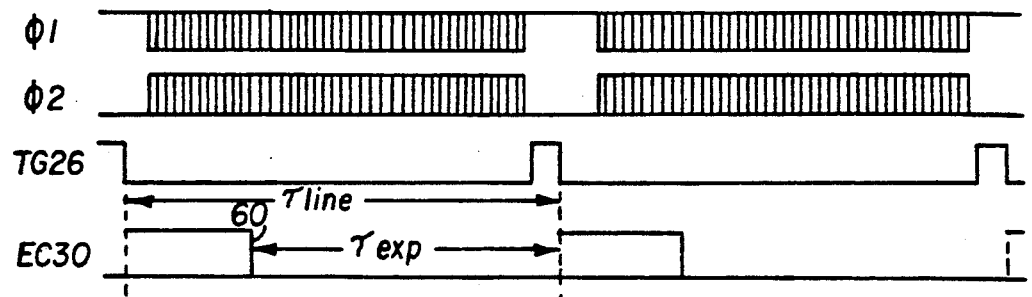
FIGS. 5 and 6 are timing diagrams illustrating the operation of the present invention.
Figure 6:
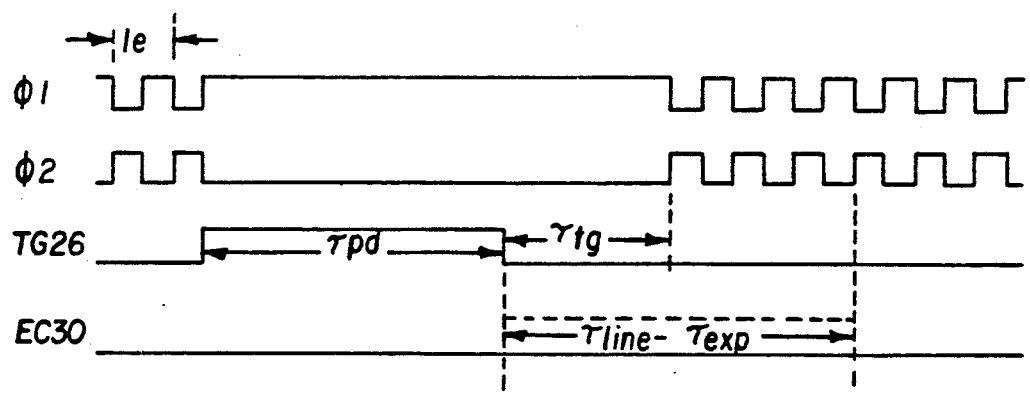

The timing required to operate image sensor 10 in order to control the integration time for a channel is shown in FIGS. 5 and 6. As shown in FIG. 5, the potential on exposure control gate 30 is raised with the falling edge of the potential on transfer gate 26 (the beginning of a line period), and is lowered at the desired point (indicated at 60) in the middle of a line period $\tau_{line}$. Consequently, the integration time $\tau_{exp}$ is the period from the falling edge of the potential on exposure control gate 30 to the next falling edge of the potential on transfer gate 26. Independent exposure control gate lines are provided to each of the channels, and thus, the integration time $\tau_{exp}$ can be independently varied for each color while maintaining a constant line time $\tau_{line}$.

The photodiode to CCD shift register timing is shown in FIG. 6. Transfer of charge carriers from the photodetectors 16 to shift register 18 occurs during the time $\tau_{pd}$. The period $\tau_{tg}$ is required to allow charge carriers under the transfer gate 26 to be cleared into the shift register 18. It will be noted that the falling edge of the potential on exposure control gate 30 is also shown to be coincident with the rising edge of the shift register clock signal $\phi 2$. The coincident timing is preferred to minimize switching artifacts on the sensor output, which might distort the image signal.

Figure 7:
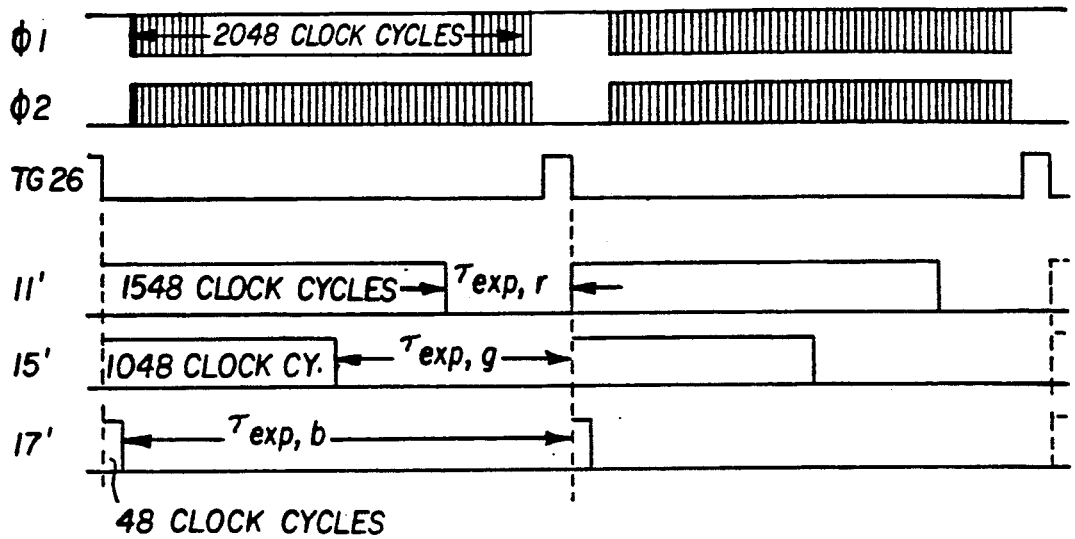
FIG. 7 is a timing diagram showing the integration times for each color in an illustrative example of the present invention.
Figure 8:
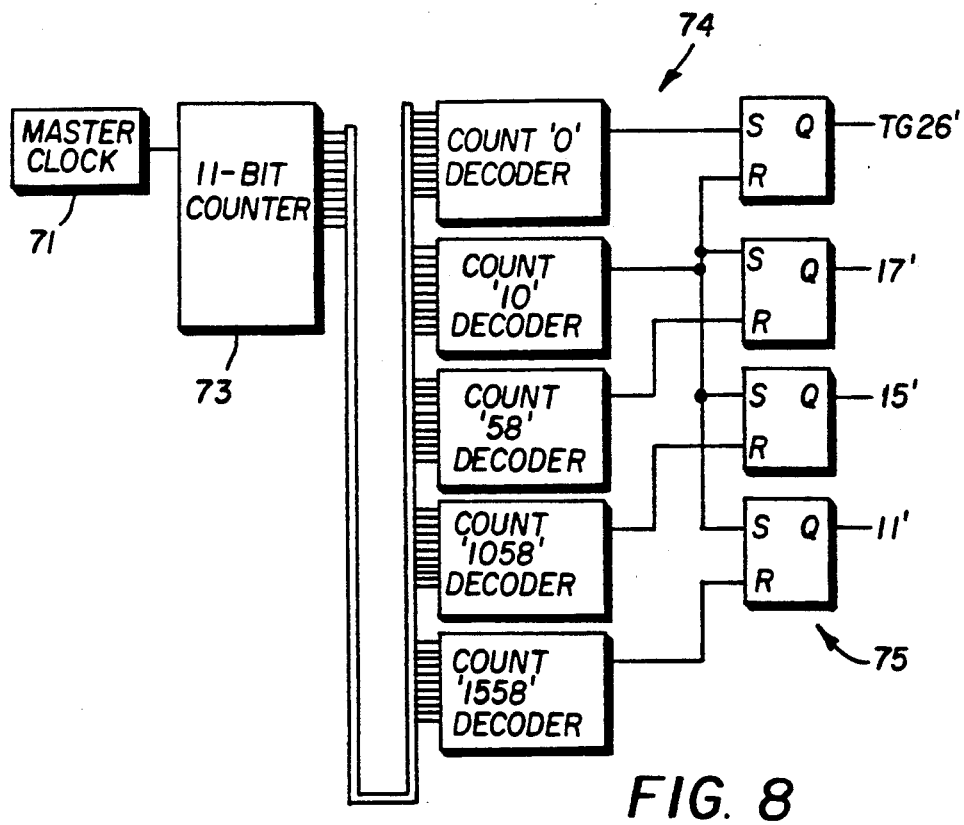
FIG. 8 is a schematic diagram of circuitry for generating timing signals for the image sensor.

The signals necessary to operate image sensor 10 in accordance with the present invention can be provided by any appropriate commercially-available logic devices. In one illustrative example of the present invention, the relative integration times for the red, green, and blue channels could be ¼, ½, and 1, respectively. FIG. 7 shows the timing pulses 11', 15', 17' for the red, green, and blue exposure control gates. The effective integration time $\tau_{exp}$ is also indicated. An example is shown in FIG. 8 of the control logic required to generate signals 11', 15', and 17', as well as the transfer gate timing pulse TG 26'. A master clock 71 cycles at the desired CCD readout rate. An 11 bit counter 73 feeds 11-bit decoders shown in blocks 74. The decoders set or reset R/S flip-flops 75 at the appropriate counts. Implementation of the arrangement shown in FIG. 8 can be performed in conventional logic devices or can be embedded in programmable logic.

The invention has been described in detail with particular reference to the preferred embodiments thereof, but it will be understood that variations and modifications can be affected within the spirit and scope of the invention.

I claim:

1. An image sensor comprising:
   a plurality of channels, each of said channels including an image sensor element which is adapted to produce a color representation of a portion of a color image, each of said channels being adapted to sense a color different from the other channels;
   means for controlling the integration time of each of said sensor elements in accordance with the color which the element is adapted to sense; and
   means for reading out signal charges from each of said channels simultaneously and in parallel.

2. An image sensor, as defined in claim 1, wherein said image sensor comprises three channels, and each of said channels includes a linear array of image sensor elements.

3. An image sensor, as defined in claim 2, wherein each of said linear arrays includes a line of photodetectors and a drain associated with each of said photodetectors.

4. An image sensor, as defined in claim 3, wherein transfer gates are located between said each of said photodetectors and the drain associated therewith.

5. An image sensor, as defined in claim 4, wherein said controlling means includes means for controlling the potential on said transfer gates.

6. An image sensor, as defined in claim 5, wherein each of said linear arrays includes a CCD shift register arranged generally parallel to said photodetectors.

7. An image sensor for sensing color images, said image sensor comprising:
   a plurality of channels spaced from each other by an integral number of pixel heights, each of said channels containing a line of image sensor elements, and each of said channels being adapted to sense a different color in an image:
   means for controlling the integration time of the sensor elements in said image sensors, the integration time of the sensor elements in one of said channels being different from the integration time of the sensor elements in another of the channels; and
   means for reading the signal charges out of said channels simultaneously and in parallel.

8. An image sensor, as defined in claim 7, wherein each of said image sensor elements includes a photodetector and a drain located adjacent the photodetector.

9. An image sensor, as defined in claim 8, wherein said controlling means includes an exposure control gate for controlling the flow of charge carriers into said drain.

10. An image sensor, as defined in claim 8, wherein each of said image sensor elements includes a CCD and a transfer gate between said photodetector and said CCD.

11. An image sensor, as defined in claim 10, wherein said means for reading the signal charges out of said channels includes clock means for said CCD's.

12. A method of sensing a color image formed on an image sensor having a plurality of arrays of image sensor elements, each of said arrays being adapted to sense one of the primary colors, said method comprising the steps of:
    controlling the effective integration time of the image sensor elements in each array in accordance with the color being sensed by that array; and
    reading signal charges out of said arrays simultaneously and in parallel.

13. A method, as defined in claim 12, wherein each of said image sensor elements includes a photodetector and a CCD, and the effective integration time of said photodetector is controlled to control the effective integration time of the image sensor elements.

14. A method, as defined in claim 13, wherein each of said elements includes a drain and an exposure control gate between said drain and the photodetector, and said controlling step includes applying a potential of a predetermined magnitude on said exposure control gate for a portion of the integration time of the photodetector.

15. A method, as defined in claim 13, wherein said reading step includes the step of clocking out the CCD's in said arrays in parallel.

* * * * *